United States Patent [19]
Rabinovitch et al.

[11] 3,973,750
[45] Aug. 10, 1976

[54] CASTING MOLD FOR DIRECTIONAL SOLIDIFICATION OF AN ALLOY

[75] Inventors: Maurice Rabinovitch, Chatillon; Hervé Bibring, Meudon, both of France

[73] Assignee: Office National d'Etudes et de Recherches Aerospatiales (O.N.E.R.A.), Chatillon, France

[22] Filed: July 7, 1975

[21] Appl. No.: 593,669

Related U.S. Application Data

[63] Continuation of Ser. No. 403,383, Oct. 4, 1973, abandoned.

[30] Foreign Application Priority Data

Oct. 6, 1972 France .............................. 72.35545

[52] U.S. Cl. .............................. 249/114; 425/60; 425/72 R; 425/364 R
[51] Int. Cl.² .............................. B22C 3/00
[58] Field of Search ................ 249/114; 164/60, 72, 164/137, 341, 364

[56] References Cited
UNITED STATES PATENTS

| | | |
|---|---|---|
| 3,506,061 | 4/1970 | Clemm .............................. 164/254 |
| 3,515,201 | 6/1970 | Zimmerman .......................... 164/72 |
| 3,684,004 | 8/1972 | Germain et al. ..................... 164/364 |
| 3,802,482 | 4/1974 | Phipps ................................ 164/72 |

*Primary Examiner*—Francis S. Husar
*Assistant Examiner*—Carl Rowold
*Attorney, Agent, or Firm*—Karl F. Ross; Herbert Dubno

[57] ABSTRACT

A mold for obtaining metallic parts with an orientated crystalline structure by the directed solidification of an alloy is disclosed. The mould comprises a body of refractory mold that is a good heat conductor and on the inner wall of said body is provided a chemically protective lining of dense refractory metal oxide, with a high degree of purity, deposited on said body by blowpipe projection as a thin non-porous layer. The thickness of the metal oxide lining is in the order of a tenth of a millimeter to five tenths of a millimeter, the oxide being choosen in the group constituted by aluminium oxide, zirconium oxide, magnesium oxide and thorium dioxide with a degree of purity at least equal to 99.5 %.

4 Claims, 6 Drawing Figures

U.S. Patent  Aug. 10, 1976  Sheet 1 of 2  3,973,750
FIG. 1
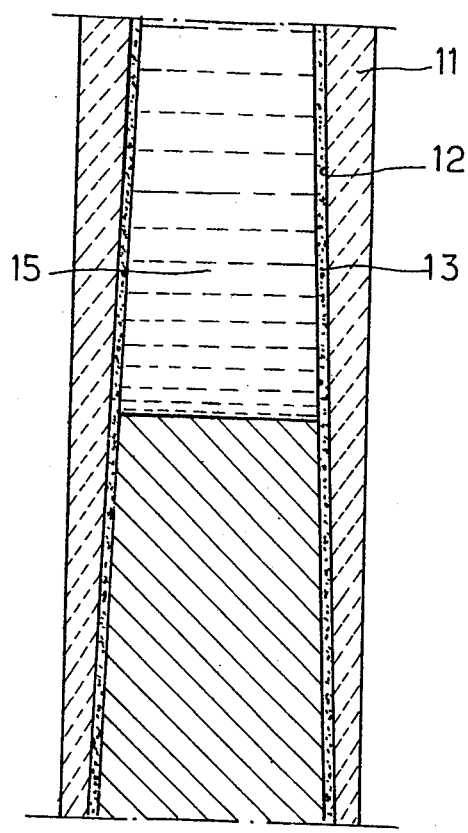
FIG. 2
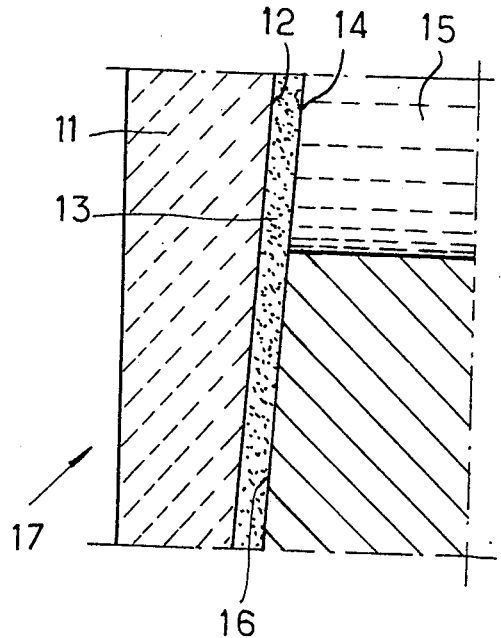
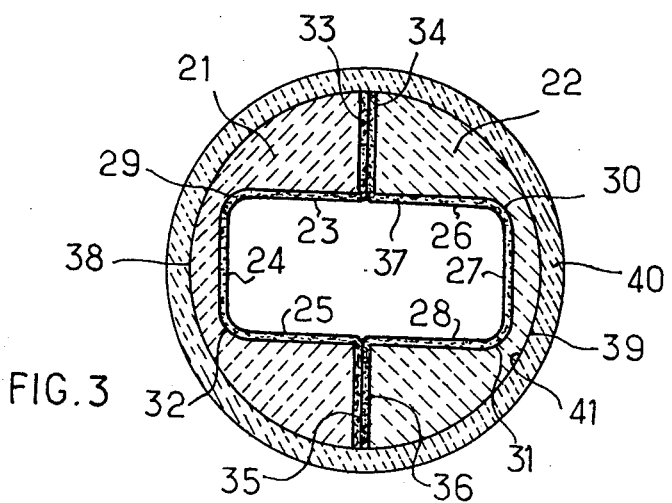
FIG. 3

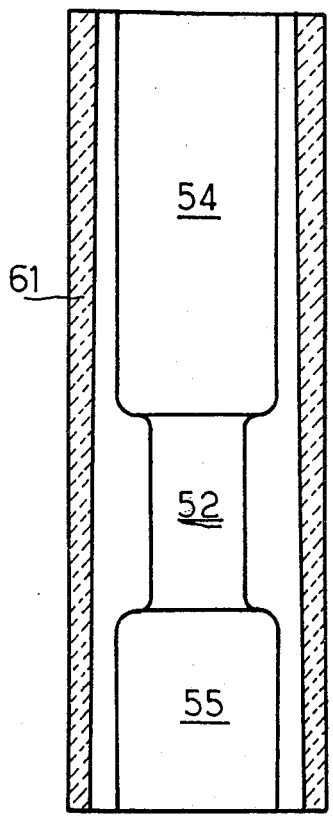
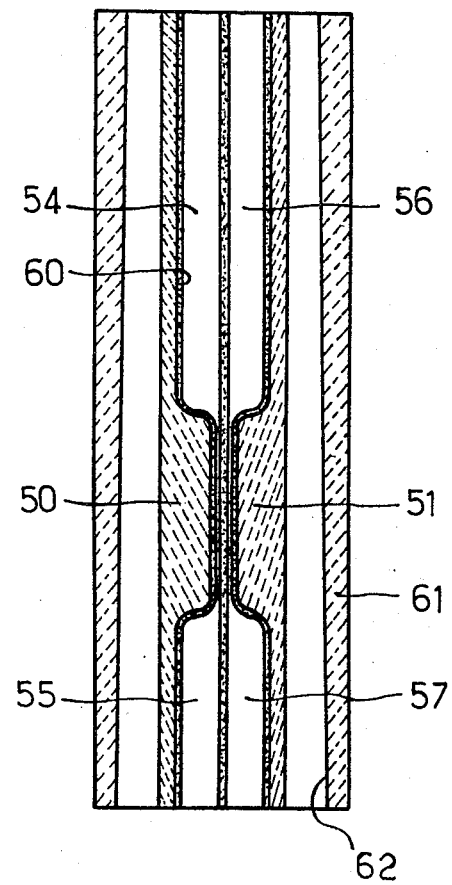
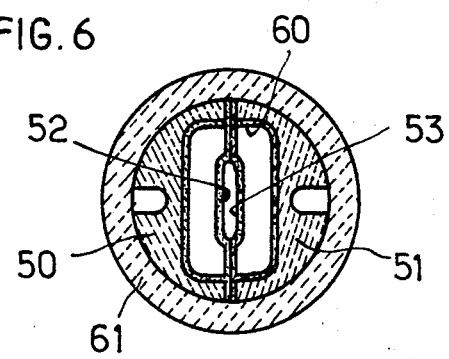

CASTING MOLD FOR DIRECTIONAL SOLIDIFICATION OF AN ALLOY

This is a continuation of application Ser. No. 403,383 filed Oct. 4, 1973, non abandoned.

The present invention relates to a mould for obtaining metallic parts having an orientated crystalline structure by the directed solidification of an alloy.

In certain metallurgical operations, essential thermal variation laws have to be observed as a function of time and also as a function of the level of the metallic mass during treatment, taking into account the necessities imposed by the temperature maintaining equipement.

This is the case when producing metallic materials having an orientated crystalline structure obtained by directed solidification, during which, in a first phase, a metallic mass disposed in a mould is brought to melting point first of all in its upper portion and then progressively in the underlying portions and, in a second phase, the treatment is conducted in such a way that the solidification interface moves progressively from bottom to top while maintaining a high temperature gradient in the neighbourhood of said interface.

Directed or orientated solidification is applied in two separate cases:

In a first case, it is applied to highly resistant refractory alloys which are subject to premature rupture by decohesion at the grain joints. It gives these alloys a very elongated grain structure with no grain joints perpendicular to the direction of solidification, and they consequently possess improved mechanical properties.

In a second case, orientated solidification is applied to certain particular two-phase alloys, such as those which are the object of the co-pending U.S. application no. 268,751 filed July 3, 1972 — and, in addition to an elongated grain structure, enables one of the phases, for each grain, to grow in the form of fibers or lamina which are parallel and uniformly distributed in the matrix. It is known that, in this second case, production must be carried out with a thermal gradient at the solidification interface three or four times greater and a solidification rate ten times lower than in the first case. The moulds thus have to withstand exceptionally severe working conditions.

As described in the aforementioned application in which we are coinventors, now U.S. Pat. No. 3,871,835, the directional solidification is carried out to produce a refractory directionally solidified polyvariant fiber-reinforced composite having eutetic-type structure consisting essentially of two distinct independent phases constituted by:

a. a complex multicomponent matrix phase consisting essentially of:
  i. at least one metal selected from the group consisting of Fe, Ni and Co, and
  ii. chromium in an amount between 10 and 25 percent by weight of the composite;
and in said matrix:
b. an in situ grown reinforcing phase free from chromium and consisting essentially of whisker-like elongated monocrystalline fibers of at least one metal monocarbide, the metal of which is selected from the group constituted by Ta, Nb, Hf and Ti.

In fact, while orientated solidification is relatively easy to apply on the laboratory scale, it has been impossible hitherto, at least in the second case, to extend the application of this working mode to obtain materials with exceptionally advantageous properties to larger quantities of metallic materials.

In an equipment suitable for this type of production, in particular, the lower part of the mould must include a cooler functioning from the very beginning of the operation so that, during the first melting phase, the upper portion of the metal contained in the mould is in a liquid state, while its lower portion is still in a solid state.

Carrying out the method of elaboration therefore implies the use of moulds of materials possessing both the properties of heat resistance and chemical inertia with respect to the alloy to be treated at a high temperature, and resistance to the stresses set up by the high thermal gradients.

Metal oxides with a melting point equal to or greater than 2,000 °C, such as aluminium oxide, zirconium oxide, magnesium oxide, thorium dioxide, which possess the required heat resisting and chemical inertia properties, are used industrially to produce tubes having a dense structure, but the moulds produced from these tubes have not given satisfaction. As a matter of fact, the thermal expansion coefficients of these materials are high, and the high thermal gradients lead to stresses being set up in the wall, causing the mould to crack. In addition, the available tubes are irregular in thickness and comprise out-of-round portions favouring the infiltration of liquid alloy between the solid portion of the ingot and the wall of the mould. These infiltrations cause thermal impacts tending to crack the wall of the mould.

As regards graphite and heat resistant metallic materials, they are good head conductors, stand up well to stress, and their good machining properties enable moulds to be produced accurately as a function of the dimensions of the parts to be treated, in order to avoid the infiltration mentioned above. However, they cannot be used owing to the chemical reactions occuring with the alloy to be treated.

It is one object of the invention to provide a mould which enables the difficulties encountered hitherto to be overcome, industrially, with respect to the manufacture of metallic parts having an orientated crystalline structure obtained by the directed solidification of an alloy.

According to the invention, this object is achieved owing to the fact that the mould comprises a body of heat resisting material that is a good heat conductor the inner wall of which is provided with a chemically protective lining of dense heat resisting metal oxide, with a high degree of purity, said lining being built by blow pipe projection in the form of a thin non porous layer.

The good results obtained with the mould according to the invention result not only from the close junction that can be obtained between the refractory metal oxide lining and the mould body, but are also due to the fact that as the metal oxide has a higher thermal expansion coefficient than that of the body material, the body continues to perform its supporting function perfectly during the rise in temperature, thus preventing any cracking in the lining.

By using a blow pipe, as a means for coating the mould body with the layer of metal oxide affording chemical protection, projecting particles of said oxide obtained from a supply rod of the like, it is possible to obtain a lining of uniform thickness, the inner surface of the mould being sufficiently uniform to match the outer surface of the metal bar subjected to the metallurgical treatment.

The heat resisting metal oxide whose purity is at least equal to 99.5% is selected from the group constituted by aluminium oxide, zirconium oxide, magnesium oxide and thorium dioxide, while the heat resisting material constituting the mould body is selected from one of the materials in the group comprising graphite, tungsten, molybdenum, tantalum and niobium.

The chemically protective lining of refractory metal oxide has a thickness in the order of 1/10 to 5/10 mm and the porosity of this lining is low or very low, below 10%.

By using a refractory metal oxide with a high degree of purity and whose silicon dioxide content is in all cases below 0.5%, the risk of alloy decarbonization by reaction at a high temperature between the silicon dioxide and the carbides, which would be particularly undesirable in the case of alloys according to the patent application above mentioned which are rich in carbides, is avoided.

In the following description, given by way of example, reference is made to the attached drawings wherein:

FIG. 1 is a longitudinal cross-section diagram of a mould according to the invention being used to produce a bar having a circular cross-section;

FIG. 2 is a larger scale cross-section of a portion of the mould;

FIG. 3 is a cross-section of an alternative designed to produce a rectangular cross-section;

FIG. 4 is a longitudinal cross-section of a mould for producing a shaped part;

FIG. 5 is a view similar to that of FIG. 4 but at an angle of 90° therefrom;

FIG. 6 is a cross-section of the mould represented in FIGS. 4 and 5.

For simplicity, in the following specification, the expression "refractory metallic materials" also includes graphite.

Reference is first made to FIGS. 1 and 2 which represent a first embodiment of the mould according to the invention. Such a mould includes a body 11 of graphite constituted by a tube whose inner surface 12 is cylindrical or advantageously having a slight taper in the order of 2%. Such a graphite tube is obtained by the usual machining techniques. An oxyacetylene blowpipe is used to deposit on the inner surface of the tube a layer 13 of aluminium oxide with a very high degree of purity, containing substantially 99.5 to 99.8% of aluminium oxide, the rest being chiefly constituted by silicon dioxide. The layer 13 forms a lining of uniform thickness, with very low porosity, the inner surface 14 of which is a frustoconical surface having the same taper as surface 12 of body 11. The porosity of aluminium oxide layer 13 obtained by deposition using an oxyacetylene blowpipe is below 15% and can be further reduced by subsequent heat treatment.

To obtain a metallic piece with an orientated crystalline structure, a bar of the desired metallic substance is taken as the outer surface 14 of lining 13 and has a degree of play which will be taken up by the expansion of the bar during the treatment. Said bar 15 is inserted into mould 17.

Mould 17 containing bar 15 is part of an apparatus comprising means for raising the temperature of bar 15 in accordance with a predetermined law over a time period varying according to the length of the bar.

It is advantageous to use graphite or a similar material which is a good conductor of electricity so that it can act as a susceptor for induction heating and avoid superficial overheating of the liquid bath.

In order to obtain orientated solidification, the base of the bar is constantly subjected to the action of cooling means and the heating, obtained by induction, is applied to the upper part of the bar, so that the upper part of the latter is converted into a liquid state, the liquefaction in interface progressively extending downwards.

Experience has shown that with the mould according to the invention there was no flow of drops or "tears" of metal along surface 14.

In this example, a solid bar was inserted in the mould but, alternatively the alloy for treatment can be introduced into the mould in a liquid state.

When the greater part of the bar is liquefied with, nonetheless, a "core" at the base remaining solid, the heat treatment is continued to solidify the portion of the bar that has previously been liquefied in accordance with a predetermined law whereby solidification begins at the bottom and extends upwards, constantly maintaining a sufficiently high temperature gradient in the neighbourhood of the rising solidification interphase to avoid any fresh forward extension of the interface as well as the formation of dentrites.

With an apparatus according to the invention, it has been possible to produce alloys with a high solidification interval and which require particularly high temperature gradient in the neighbourhood of the interface.

The solidification interface is plane and horizontal.

The solidification rate can be comprised between 0.6 cm/hour and 5 cm by hour for alloys whose melting points are comprised between 1300° and 1400°C. For these alloys, the necessary temperature gradients are between 100° and 200°C. For these alloys, the obtaining of a high temperature gradient implies considerable overheating of the liquid bath and temperatures of 1700° to 1750°C are reached. Solidification takes place in elongated crystals the axes of which are substantially parallel according to the so-called orientated solidification process.

Stripping, when solidification is complete, is problem free.

The same type of graphite tube can be used for a variety of productions with, between each operation, renewal of the aluminium oxide lining.

An aluminium oxide lining obtained by "poteying" onto a graphite body does not allow the orientated solidification process to occur satisfactorily owing to the chemical reactions between the metal being produced and the aluminium oxide, which is then in a porous form. In addition, owing to the porosity of the layer of aluminium oxide, when it is added by poteying, this porosity being possibly in the order of 30% and above, prolonged contact with the wall of the mould and the superheated liquid alloy gives rise to a "watering" phenomenon, i.e. penetration in depth by the liquid alloy into the wall of the mould. Such a phenomenon considerably increases the surface of the mould in contact with the alloy and, hence, the risk of chemical reaction resulting in undesirable impoverishment of the alloy in one of two of its constituing elements, the metallic casting additionally possessing, after stripping, a rough surface state which cannot be considered as satisfactory.

Among the refractory metallic materials usable to constitute the mould body, the following can be mentioned in addition to graphite: tungsten, molybdenum, tantalum, niobium.

Among refractory metal oxides very suitable for constituting the lining, the folliwing can be cited in addition to aluminium oxide: zirconium oxide, magnesium oxide, thorium dioxide or mixed compounds of the spinel type (e.g. magnesiumaluminium oxide) of said oxides.

EXAMPLE I

A graphite tube with the following dimensions is machined:
length: 160 mm
maximum inside diameter: 56.5 mm
outside diameter: 61.5 mm
The bore taper is 2 %.

The inside lining is constituted by pure aluminium oxide (99.8%) and is obtained by projecting by means of an oxyacetylene blowpipe. Its thickness is 0.5 mm.

In other cases, linings with a thickness comprised between 0.1 and 1 mm have been obtained.

Owing to the very low silicon dioxide content of the aluminium oxide used, which is practically pure, no significant drop in the carbide content is noted when the cast alloy contains them, after solidification.

By way of a comparative example, the solidification of a cobalt base alloy containing 0.75% by weight of carbides, in a shell mould produced by the so-called "disposable wax" method with a mould wall constituted by aluminium oxide with 5% silicon dioxide leads, after solidification, to a carbide content in the order of 0.25% by weight.

EXAMPLE II

In another embodiment, FIG. 3, the mould comprises two graphite shells with a semi-fine structure such as supplied by the LE CARBONE-LORRAINE (a French Company of Paris-France), 21 and 22 whose inner faces 23, 24, 25 and 26, 27, 28 respectively have a U shaped cross-section and form a substantially rectangular alveole with the rounded fillets in corners 29, 30, 31, 32. The inner face of the alveole, as well as the opposite faces 33 and 34, 35 and 36 receive a 0.5 mm thick aluminium oxide lining 37 which is added by oxyacetylene blowpipe projection. Said opposite faces are then ground. Each of the shells 21, 22 has a frustoconical outer surface 38 and 39 respectively, and the fitting of a graphite jacket 40 with an inner frustoconical surface 41, matching surface 39, ensures that the shell halves are pressed against one another by their faces 33, 35 and 34, 36. With such a mould, parallelepiped ingots can be unidirectionally solidified.

To carry out the solidifying operation, by high frequency induction heating (250 kHz) in an argon atmosphere, the mould is installed in the furnace on a cooled piston. An alloy ingot, for example a cobalt base ingot containing chromium, nickel and tantalum carbide is inserted in the mould and heating is carried out so that the ingot melts from top to bottom until the solid-liquid interface 1350°C) is approximately 2 cm above the base of the ingot, the inductor being 2 cm above the interface. The mould is then displaced downwards at the rate of 1.2 cm/hour for the unidirectional solidification operation and, after 6 hours, 7.2 cm are solidified.

The furnace structure is such that the temperature gradient at the solid-liquid interface is approximately 130°C/cm this gradient remaining constant throughout the operation.

The ingot obtained has the desired appearance, microstructure and mechanical properties.

EXAMPLE III

In another embodiment, provided for solidifying a shaped part, for example a turbine blade blank, FIGS. 4 to 6, the mould comprises two shells 50 and 51 of semi-fine structured graphite such as supplied by the LE CARBONE-LORRAINE, whose inner faces comprise on either side of a hollowed portion 52 and 53, respectively, U-shaped cross-sections represented at 54 and 55 for shell 50 and at 56 and 57 in the case of shell 51. The inner surface of the hollowed portions and U-shaped cross-sections, as well as the planes of the joints of the two shells, receive a 0.5 mm thick pure aluminium oxide lining by plasma blowpipe projection. The porosity of the aluminium oxide lining is in the order of 8% Each of the shells 50 and 51 has an outer frustoconical surface with a taper in the order of 2%; a jacket 61 with a frustoconical inner surface 62 is fitted to match the outer surface of the two shells ensuring that these are pressed against one another by their joint planes.

For unidirectionally solidifying a shaped part with such a mould, two ingots are disposed in the lower and upper cavities respectively of the mould.

Melting is carried out as in the previous example from top to bottom, the melting of the ingot placed in the upper portion enabling those parts of the mould not initially filled with alloy to be filled.

We claim:

1. A mold for the directional solidification of a metal alloy composite to produce a refractory directionally solidified polyvariant fiber-reinforced composite having eutetic-type structure consisting essentially of two distinct independent phases constituted by:
    a. a complex multicomponent matrix phase consisting essentially of:
        i. at least one metal selected from the group consisting of Fe, Ni and Co, and
        ii. chromium in an amount between 10 and 25 percent by weight of the composite;
    and in said matrix:
    b. an in situ grown reinforcing phase free from chromium and consisting essentially of whisker-like elongated monocrystalline fibers of at least one metal monocarbide, the metal of which is selected from the group constituted by Ta, Nb, Hf and Ti, said mold comprising an elongated hollow body composed of a refractory material selected from the group which consists of graphite, tungsten, molybdenum, and tantalum, and a thermally blowpipe applied coating of a refractory metal oxide coating the interior of said body in a uniform-thickness layer of a thickness of substantially 0.1 to 0.5 mm and of a porosity of at most 10%, said refractory metal oxide being selected from the group which consists of aluminum oxide, and having a purity of at least 99.5%, said body and said layer being dimensioned to permit a solidification rate of 0.5 to 6 cm/hour for alloys having a melting point of 1300°C to 1400°C and heated to a temperature of 1700°C to 1750°C.

2. The mold defined in claim 1 wherein said coating is applied from a plasma.

3. The mold defined in claim 1 wherein said coating is applied by flame spraying.

4. In the formation of a metal object by the directional solidification of a metal alloy, said alloy having a composition adapted to produce a refractory directionally solidified polyvariant fiber-reinforced composite having eutectic-type structure consisting essentially of two distinct independent phases constituted by:
  a. a complex multicomponent matrix phase consisting essentially of:
     i. at least one metal selected from the group consisting of Fe, Ni and Co, and
     ii. chromium in an amount between 10 and 25 percent by weight of the composite;
  and in said matrix:
  b. an in situ grown reinforcing phase free from chromium and consisting essentially of whisker-like elongated monocrystalline fibers of at least one metal monocarbide, the metal of which is selected from the group constituted by Ta, Nb, Hf and Ti, said alloy being melted in an elongated mold along which a solidification interface is shifted with a high temperature gradient across said interface to form said matrix phase and said reinforcing phase the improvement wherein said mold is reusable after each formation of an object therein and comprises a hollow mold body of a heat resistant material of high thermal conductivity selected from the group which consists of graphite, tungsten, molybdenum and tantalum, and wherein said body is internally coated before each use with a uniform-thickness layer of a refractory metal oxide by thermal blow pipe coating, said refractory metal oxide being aluminum oxide, with a purity of at least 99.5%, said coating being carried out to form a layer of the thickness of 0.1 to 0.5 mm with a porosity of at most 10%, said body and said layer being dimensioned to permit a solidification rate of 0.5 to 6 cm/hour for alloys having a melting point of 1300°C to 1400°C and heated to a temperature of 1700°C to 1750°C.

* * * * *